US009141242B2

(12) United States Patent
Yeh et al.

(10) Patent No.: US 9,141,242 B2
(45) Date of Patent: Sep. 22, 2015

(54) ELECTRODE STRUCTURE AND CAPACITANCE SENSOR HAVING THE SAME

(71) Applicant: J TOUCH CORPORATION, Taoyuan County (TW)

(72) Inventors: Yu-Chou Yeh, Taoyuan County (TW); Ting-Ching Lin, Taoyuan County (TW); Kun-Ming Chang, Taoyuan County (TW); Yi-Chin Chen, Taoyuan County (TW)

(73) Assignee: JTOUCH CORPORATION, Taoyuan County (TW)

( * ) Notice: Subject to any disclaimer, the term of this patent is extended or adjusted under 35 U.S.C. 154(b) by 243 days.

(21) Appl. No.: 13/974,650

(22) Filed: Aug. 23, 2013

(65) Prior Publication Data

US 2015/0054529 A1    Feb. 26, 2015

(51) Int. Cl.
G01D 5/24 (2006.01)
G06F 3/044 (2006.01)
G01R 27/26 (2006.01)
G06K 9/00 (2006.01)
G01R 27/22 (2006.01)

(52) U.S. Cl.
CPC G06F 3/044 (2013.01); G01D 5/24 (2013.01); G01R 27/2605 (2013.01); G06K 9/0002 (2013.01); G01R 27/22 (2013.01); G06K 9/00013 (2013.01)

(58) Field of Classification Search
CPC ...... G01D 5/24; G06F 3/044; G06K 9/00013; G06K 9/0002; G01R 27/22; G01R 27/226; G01R 27/2605
USPC .......... 324/600, 649, 658, 686, 690; 345/173, 345/174; 702/47, 52
See application file for complete search history.

(56) References Cited

U.S. PATENT DOCUMENTS

| | | | | |
|---|---|---|---|---|
| 6,819,316 B2* | 11/2004 | Schulz et al. | ... | 345/174 |
| 8,686,308 B2* | 4/2014 | Kuriki | ... | 200/600 |
| 2009/0002337 A1* | 1/2009 | Chang | ... | 345/174 |
| 2013/0148197 A1* | 6/2013 | Franke et al. | ... | 359/483.01 |
| 2014/0292710 A1* | 10/2014 | Koito et al. | ... | 345/174 |

* cited by examiner

*Primary Examiner* — Hoai-An D Nguyen
(74) *Attorney, Agent, or Firm* — Kirton McConkie; Evan R. Witt

(57) ABSTRACT

Provided is an electrode structure for use with a capacitive touch panel to enhance capacitance sensing capability thereof. The electrode structure includes electrically conductive fine lines each forming fine line portions, sensing portions, and cross portions. The fine line portions, the sensing portions, and the cross portions together form a latticed pattern. The sensing portions are each disposed between two adjacent ones of the cross portions. Two ends of each said sensing portion are connected to two said cross portions through two fine line portions, respectively. The sensing portions each have a geometric configuration with a short axis and a long axis. The long axis extends in the direction of a corresponding one of the fine line portions. The short axis is of a width larger than a corresponding one of the fine line portions.

10 Claims, 9 Drawing Sheets

ELECTRODE STRUCTURE AND CAPACITANCE SENSOR HAVING THE SAME

FIELD OF THE INVENTION

The present invention relates to electrode structures for use with a capacitive touch panel, and more particularly, to a latticed electrode structure comprising metallic fine lines and a capacitance sensor.

BACKGROUND OF THE INVENTION

Indium tin oxide (ITO) is widely used to form electrodes for use with conventional touch panels, because of its two chief properties, its electrical conductivity and optical transparency. However, with touch panels being increasingly large, ITO-based electrodes demonstrate disadvantages, such as high resistance and slow response to a touch. In attempt to overcome the aforesaid disadvantages, related manufacturers came up with a solution—making the electrodes from metallic fine lines, wherein it is necessary for the metallic fine lines to have a fine pitch (shown in FIG. 1) such that the metallic fine lines are hardly visible. However, the solution brings about new problems—an overly small capacitance sensing area, and difficulty in detecting variable capacitance. As a result, touch panels with electrodes made from metallic fine lines in accordance with the prior art typically manifest unsatisfactory performance in detecting a touch location, thereby ending up with low touch control sensitivity and precision.

In view of the aforesaid drawbacks of the prior art in making electrodes from metallic fine lines, the inventor of the present invention conceived room for improvement in the prior art and thus developed an electrode structure and a capacitance sensor having the electrode structure as disclosed in the present invention to overcome the aforesaid drawbacks of the prior art.

SUMMARY OF THE INVENTION

It is an objective of the present invention to provide an electrode structure capable of enhancing the capacitance sensing capability of a touch panel equipped with the electrode structure.

In order to achieve the above and other objectives, the present invention provides an electrode structure for use with a capacitive touch panel, comprising: a plurality of electrically conductive fine lines each forming a plurality of fine line portions, a plurality of sensing portions, and a plurality of cross portions, wherein the fine line portions, the sensing portions, and the cross portions together form a latticed pattern, wherein the sensing portions are each disposed between two corresponding ones of the cross portions, and two ends of each said sensing portion are connected to two corresponding ones of the cross portions through two corresponding ones of the fine line portions, respectively, the sensing portions each having a geometric configuration with a short axis and a long axis, the long axis extending in a direction along the adjacent fine line portion, and the short axis being of a width larger than a width of the adjacent fine line portion.

The present invention further provides a capacitance sensor for use with a capacitive touch panel, comprising: a first electrode comprising a plurality of electrically conductive first fine lines; and a second electrode comprising a plurality of electrically conductive second fine lines, wherein the aforesaid plurality of first fine line portions, the aforesaid plurality of first sensing portions, and the aforesaid plurality of first cross portions are formed on each of the first fine lines, and the aforesaid plurality of second fine line portions, the aforesaid plurality of second sensing portions, and the aforesaid plurality of second cross portions are formed on each of the second fine lines, wherein each said first sensing portion of the first electrode and a corresponding one of the second sensing portions of the second electrode insulate and overlap each other.

BRIEF DESCRIPTION OF DRAWINGS

To enable persons skilled in the art to fully understand the technical features and advantages of the present invention, the present invention is hereunder illustrated with preferred embodiments in conjunction with the accompanying drawings, in which.

DETAILED DESCRIPTION OF THE EMBODIMENTS

Figure 1:
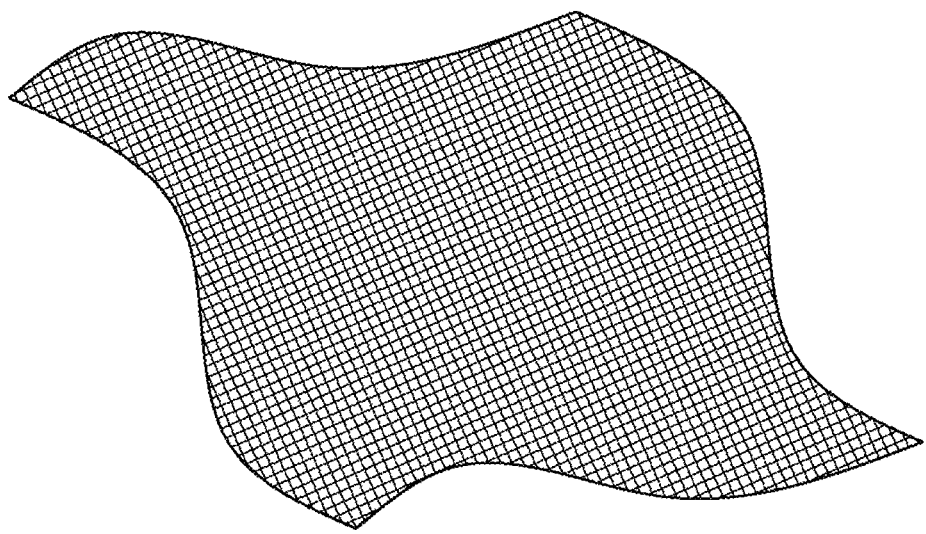
FIG. 1 (PRIOR ART) is a schematic view of a conventional electrode structure for use with a capacitive touch panel.
Figure 2:
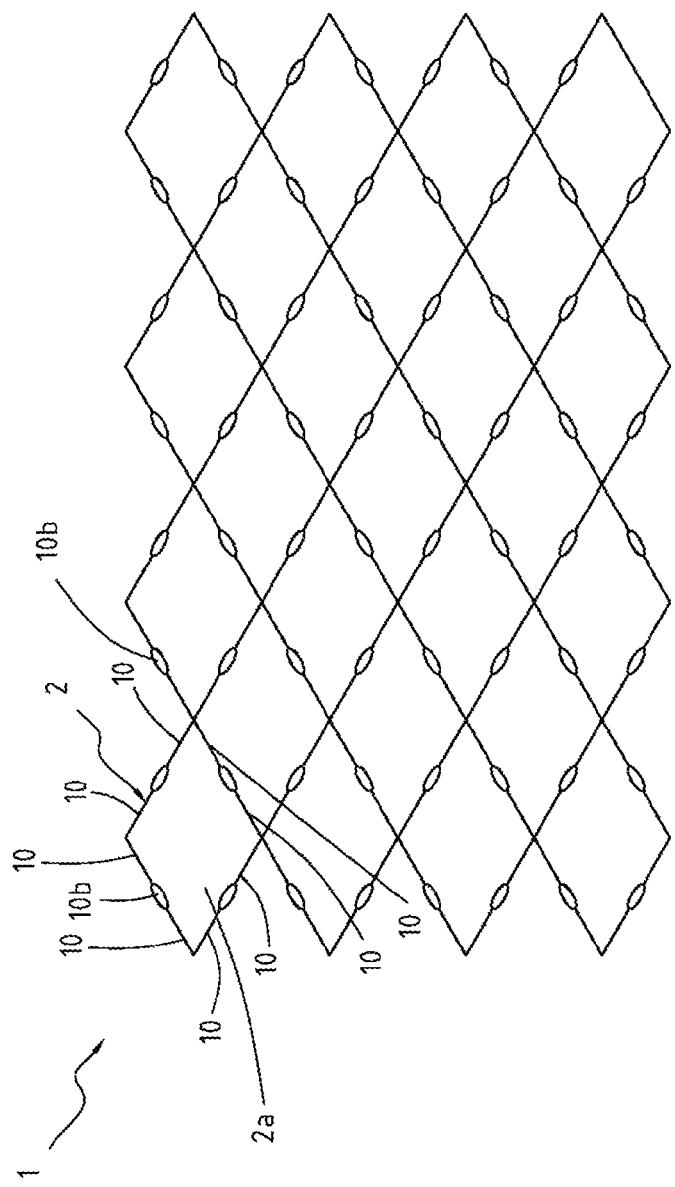
FIG. 2 is a schematic view of an electrode structure for use with a capacitive touch panel according to the first embodiment of the present invention.
Figure 3:
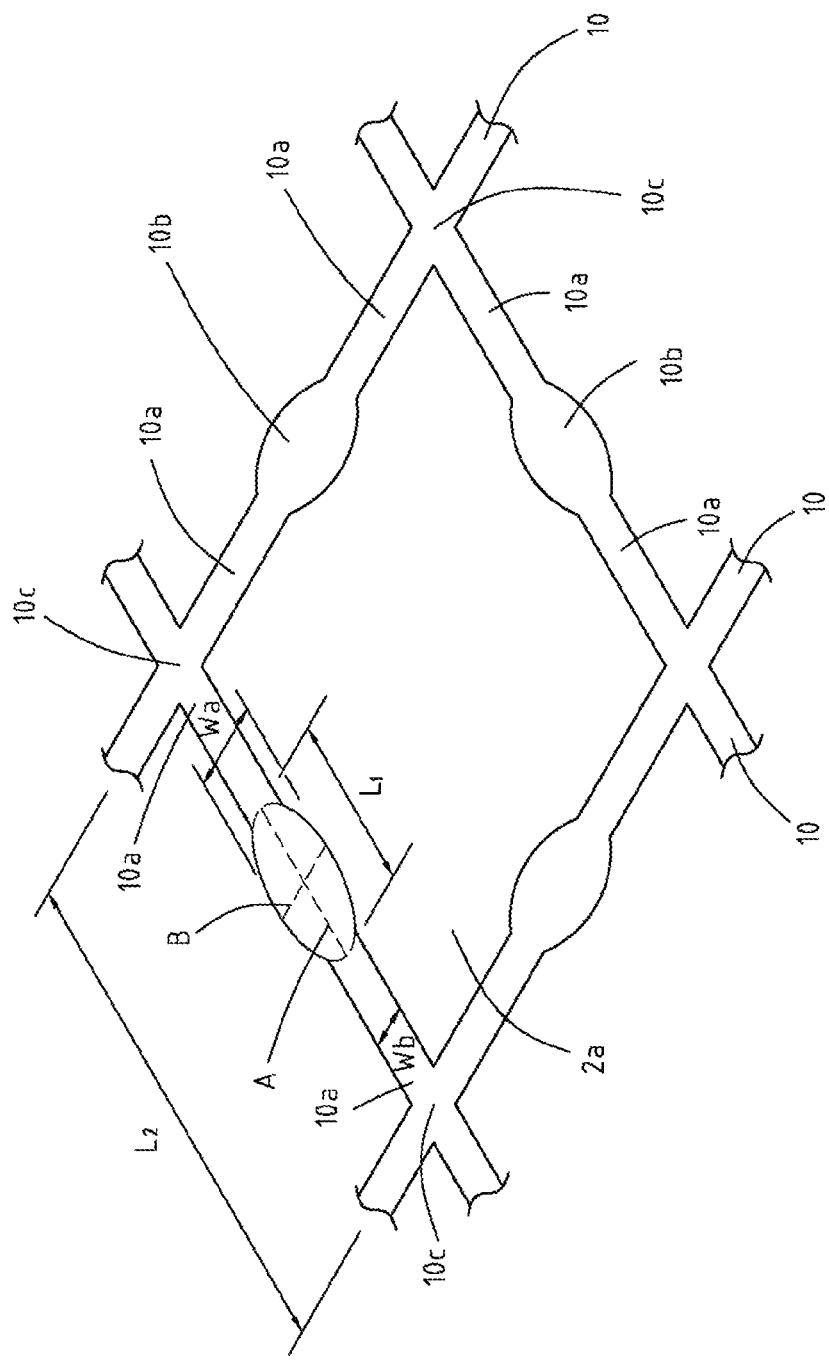
FIG. 3 is a partial enlarged schematic view of the electrode structure shown in FIG. 2.

Referring to FIG. 2 and FIG. 3, an electrode structure 1 of the present invention is for use with a capacitive touch panel and thus is for use with an electronic apparatus having the aforesaid capacitive touch panel, such as a flat-panel monitor, a notebook computer, a tablet computer, or a smartphone. The electrode structure 1 of the present invention comprises a plurality of electrically conductive fine lines 10, wherein the fine lines 10 cross to form a latticed pattern 2, and the latticed pattern has a plurality of squares 2a.

According to the present invention, the fine lines 10 form a plurality of fine line portions 10a, a plurality of sensing portions 10b, and a plurality of cross portions 10c, wherein the fine line portions 10a, the sensing portions 10b, and the cross portions 10c together form the latticed pattern 2. Referring to FIG. 3, one said square 2a of the latticed pattern 2 is surrounded by four said cross portions 10c, four said sensing portions 10b, and eight said fine line portions 10a. As regards their physical properties, the fine lines 10 are electrically conductive. The fine lines 10 are made of a metallic electrically conductive material, such as copper, aluminum, nickel, iron, gold, silver, stainless steel, tungsten, chromium, titanium, or an alloy thereof.

The sensing portions 10b are each disposed between two corresponding ones of the cross portions 10c, for example, at the midpoint between the two corresponding ones of the cross portions 10c. The two ends of each said sensing portion 10b are connected to two corresponding ones of the cross portions 10c through two corresponding ones of the fine line portions 10a, respectively.

To enhance the capacitance sensing capability and thus improve the capacitive touch panel, the present invention features the improvement of the shape of the sensing portions 10b, such that the sensing portions 10b each have a relatively large sensing area. The shape of each of the sensing portions 10b of the present invention is a geometric configuration with a long axis A and a short axis B. The long axis A is of a larger length than the short axis B. The long axis A extends in the direction along the adjacent fine line portion 10a. The width Wa of the short axis B is larger than the width Wb of the adjacent fine line portion 10a. In a specific embodiment of the present invention, $Wb*1.1 \leq Wa \leq Wb*1.8$.

Assuming that the length of the long axis A of the sensing portions 10b is denoted with L1 and that each side of each said square 2a of the latticed pattern 2 is denoted with L2, the relationship between L1 and L2 in a specific embodiment of the present invention is defined by a compound inequality, that is, $L2*0.08 \leq L1 \leq L2*0.1$.

For instance, the sensing portions 10b are each of an elliptic shape, a rhomboid shape, or a rectangular shape. The junction of two corresponding ones of the fine lines 10 crossing each other is the cross portion 10c. The fine line portions 10a are each a straight line or a curve. The fine line portions 10a are each of a width of 3 μm to 8 μm.

Figure 4:
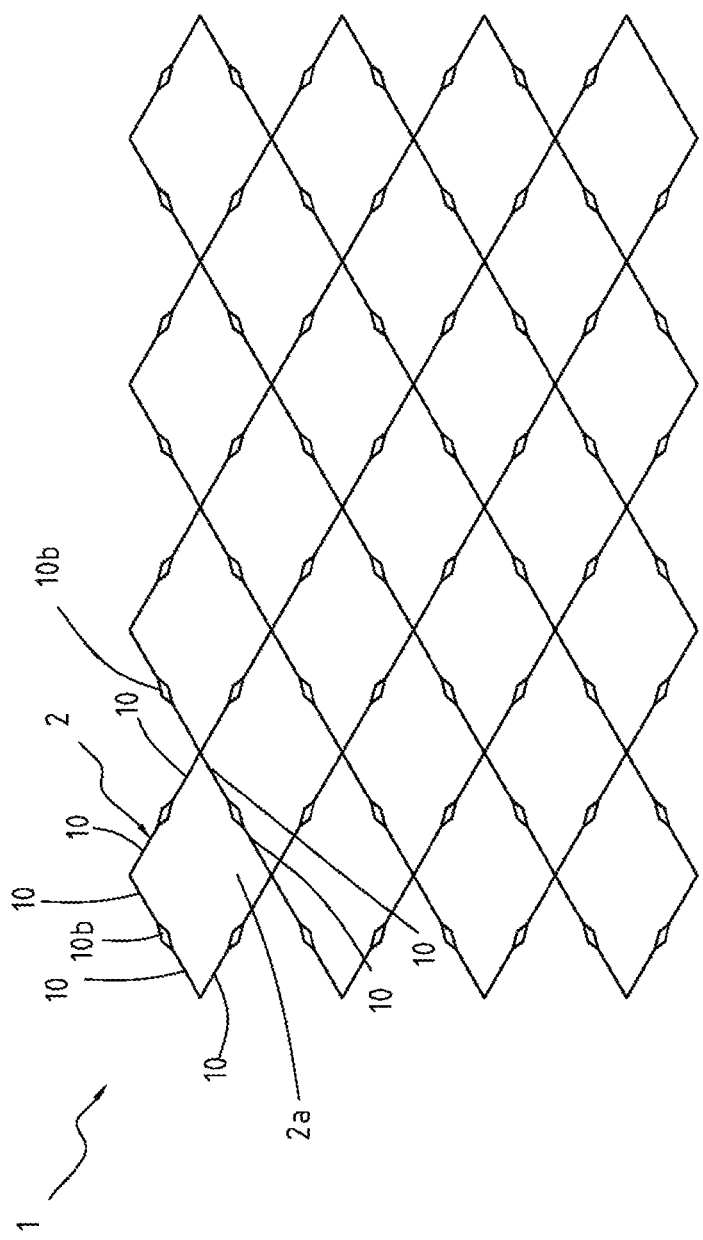
FIG. 4 is a schematic view of an electrode structure for use with a capacitive touch panel according to the second embodiment of the present invention.
Figure 5:
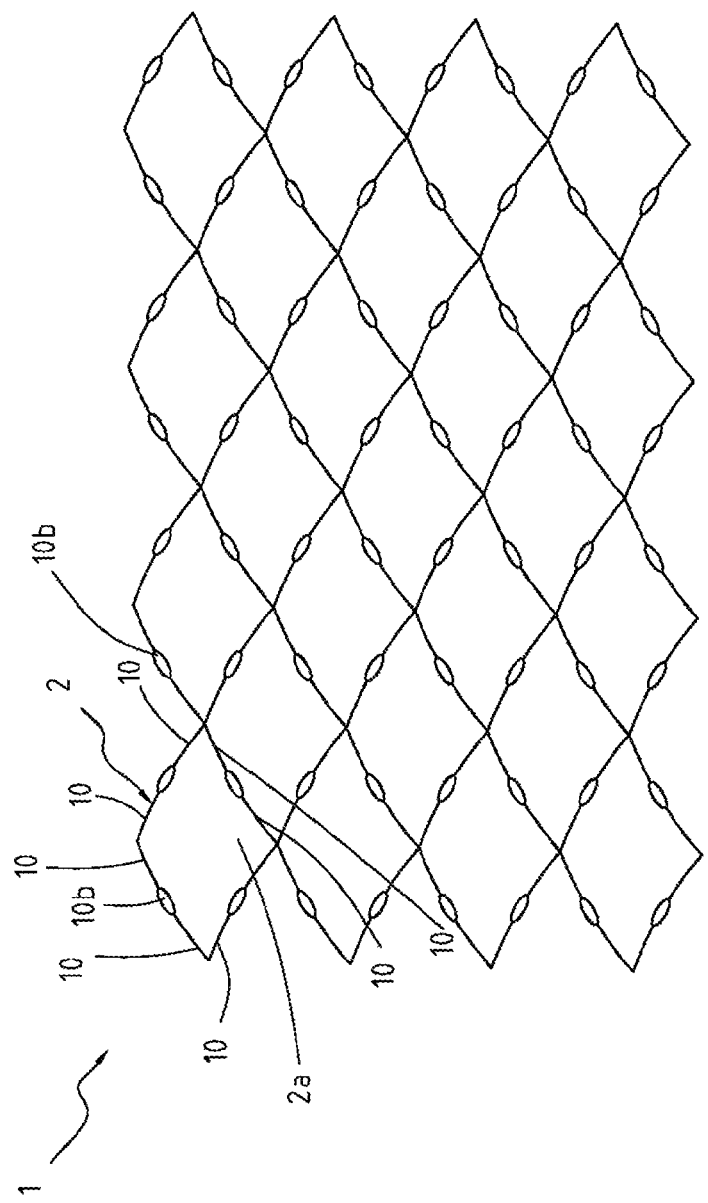
FIG. 5 is a schematic view of an electrode structure for use with a capacitive touch panel according to the third embodiment of the present invention.
Figure 6:
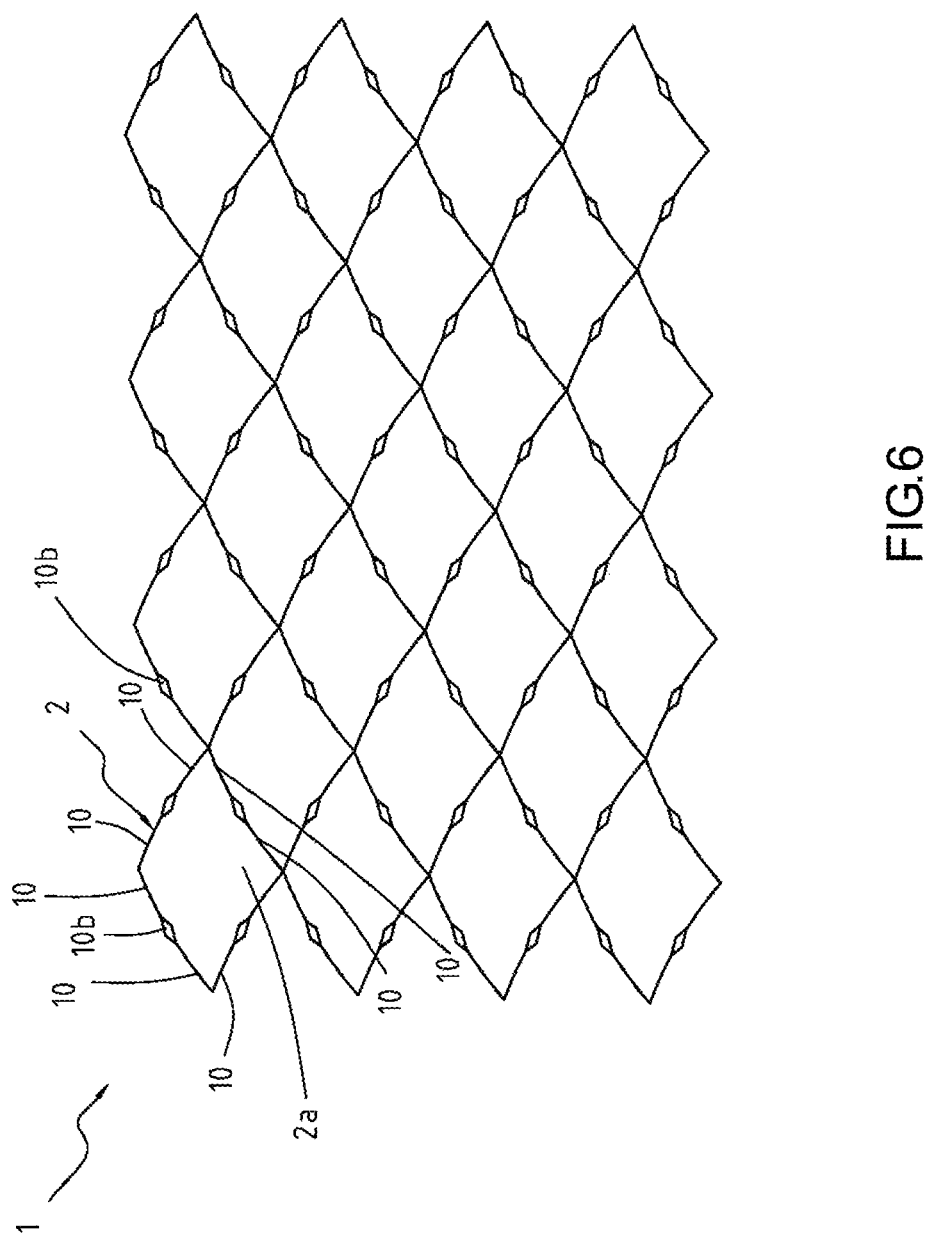
FIG. 6 is a schematic view of an electrode structure for use with a capacitive touch panel according to the fourth embodiment of the present invention.

In the first embodiment of the present invention, the geometric configuration of the sensing portions 10b of the electrode structure 1 is elliptic, whereas the fine line portions 10a each look like a short straight line. Referring to FIG. 4, in the second embodiment of the present invention, the geometric configuration of the sensing portions 10b of the electrode structure 1 is rhomboid, whereas the fine line portions 10a each look like a short straight line. Referring to FIG. 5, in the third embodiment of the present invention, the geometric configuration of the sensing portions 10b of the electrode structure 1 is elliptic, whereas the fine line portions 10a each look like a short curve. Referring to FIG. 6, in the fourth embodiment of the present invention, the geometric configuration of the sensing portions 10b of the electrode structure 1 is rhomboid, whereas the fine line portions 10a each look like a short curve.

Figure 7:
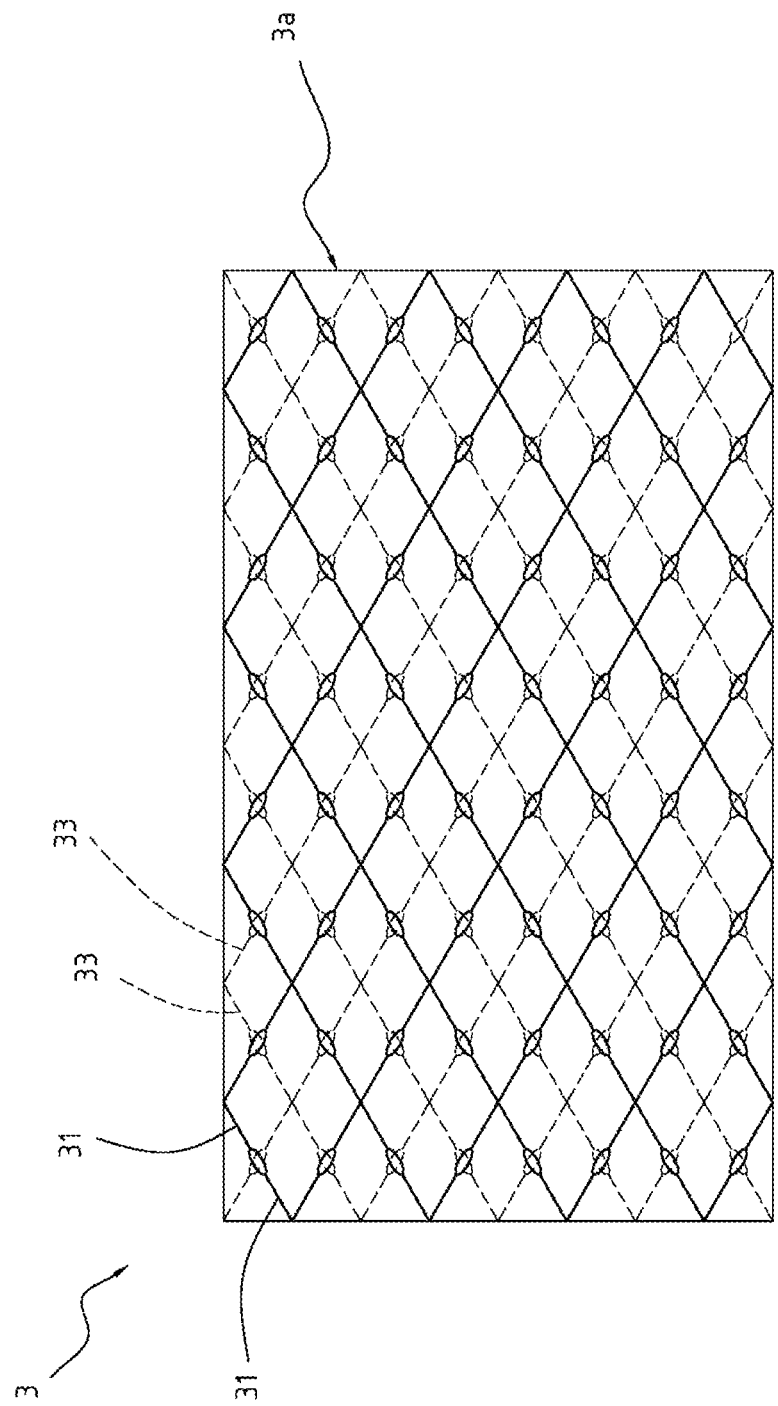
FIG. 7 is a schematic view of a capacitance sensor for use with a capacitive touch panel according to the present invention.
Figure 8:
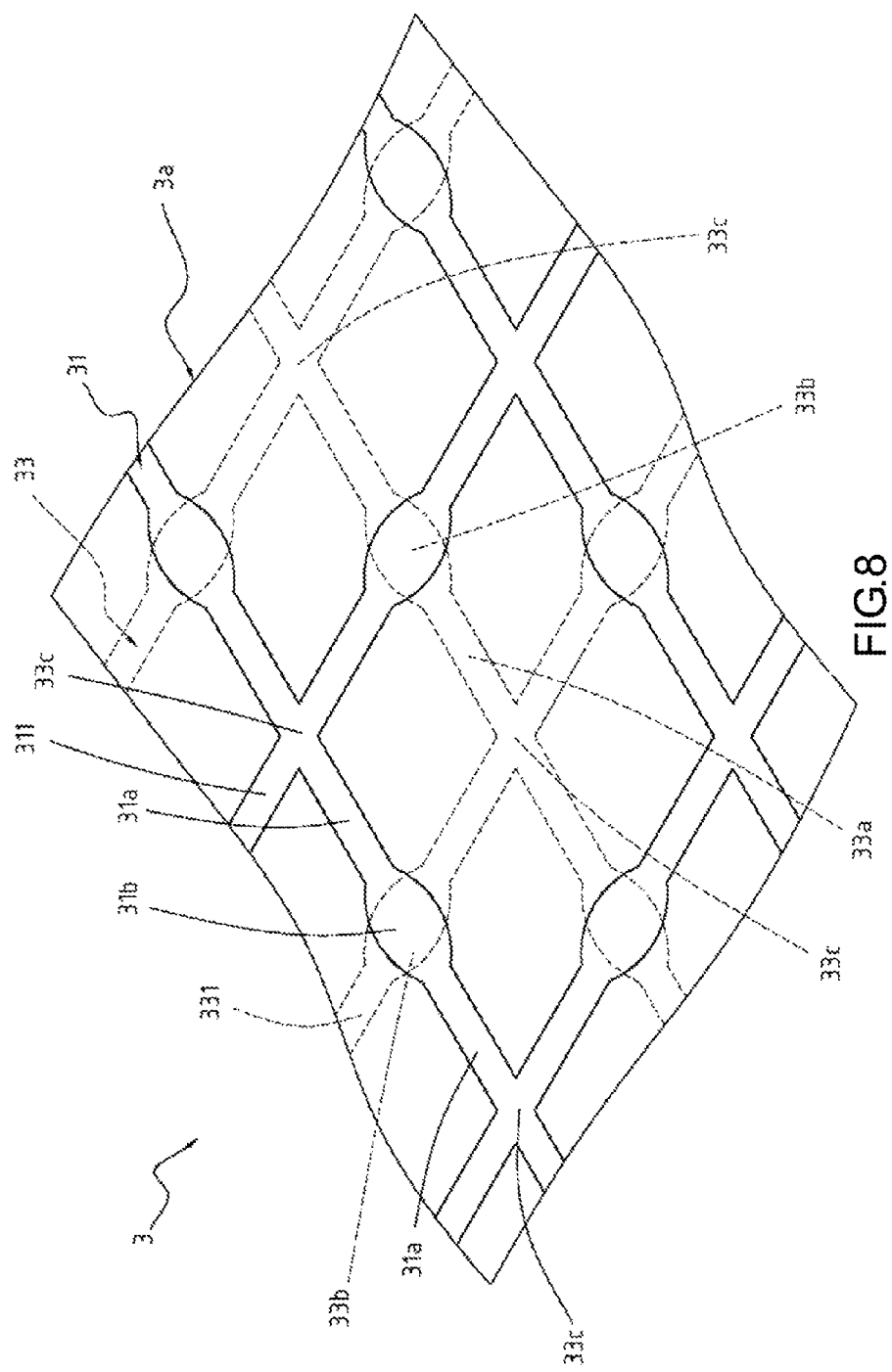
FIG. 8 is a partial enlarged schematic view of the capacitance sensor shown in FIG. 7.

The application of the electrode structure 1 to a capacitance sensor 3 is described below. Referring to FIG. 7 and FIG. 8, the capacitance sensor 3 of the present invention comprises a first electrode 31 and a second electrode 33, wherein each of first sensing portions 31b of the first electrode 31 and a corresponding one of second sensing portions 33b of the second electrode 33 insulate and overlap each other. The first electrode 31 and the second electrode 33 in FIG. 7 and FIG. 8 are formed on the upper surface and the lower surface of a transparent substrate 3a.

The first electrode 31 comprises a plurality of electrically conductive first fine lines 311. The first fine lines 311 have the same structure as the fine lines 10 do. A plurality of first fine line portions 31a, a plurality of first sensing portions 31b, and a plurality of first cross portions 31c are formed on each said first fine line 311. The first fine line portions 31a, first sensing portions 31b, and first cross portions 31c have the same structure as the fine line portions 10a, sensing portions 10b, and cross portions 10c do, respectively.

The second electrode 33 comprises a plurality of electrically conductive second fine lines 331. The second fine lines 331 have the same structure as the fine lines 10 do. A plurality of second fine line portions 33a, a plurality of second sensing portions 33b, and a plurality of second cross portions 33c are formed on each said second fine line 331. The second fine line portions 33a, second sensing portions 33b, and second cross portions 33c have the same structure as the fine line portions 10a, sensing portions 10b, and cross portions 10c do, respectively.

Referring to FIG. 8, the first electrode 31 is positioned above the second electrode 33, wherein each said first sensing portion 31b and an underlying one of the second sensing portions 33b insulate and overlap each other and are paired. The paired first sensing portion 31b and second sensing portion 33b generate a capacitance. Due to the specific shapes of the sensing portions of the present invention, the sensing portions each have a relatively large sensing area whereby the capacitance sensing capability of a touch panel equipped with the electrode structure 1 is enhanced.

Figure 9:
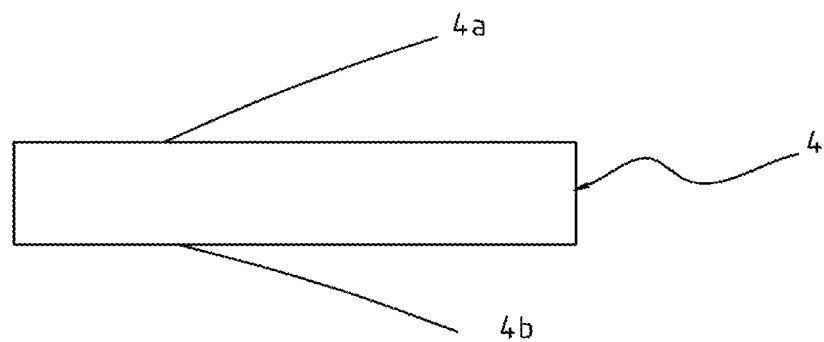
FIG. 9 is a schematic view which shows that a first electrode and a second electrode of the capacitance sensor are formed at a transparent substrate according to the present invention.
Figure 10:
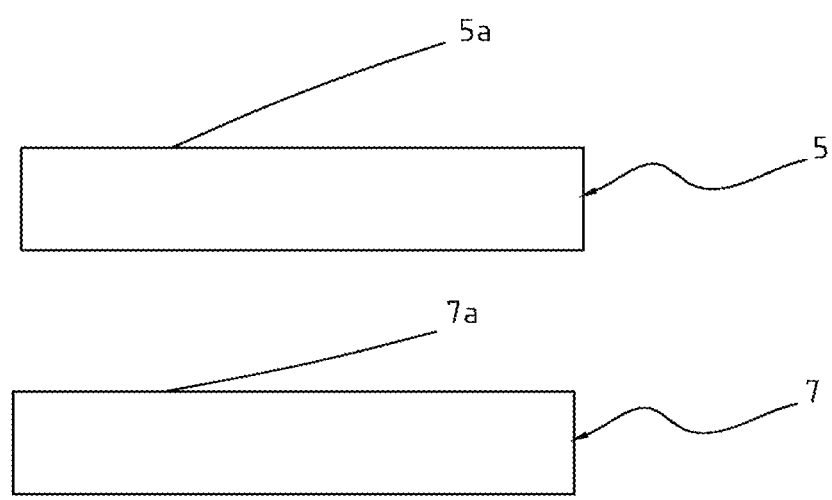
FIG. 10 is a schematic view which shows that the first electrode and the second electrode of the capacitance sensor are formed at two transparent substrates, respectively, according to the present invention.

Referring to FIG. 9, there is shown a schematic view of the capacitance sensor 3 according to the first embodiment of the present invention. As shown in the diagram, the first electrode 31 (not shown) and the second electrode 33 (not shown) are formed on an upper surface 4a and a lower surface 4b of a transparent substrate 4, respectively. Referring to FIG. 10, there is shown a schematic view of the capacitance sensor 3 according to the second embodiment of the present invention. As shown in the diagram, the first electrode 31 (not shown) is formed on a surface 5a of a transparent substrate 5, and the second electrode 33 (not shown) is formed on a surface 7a of a transparent substrate 7.

Hence, the present invention meets the three requirements of patentability, namely novelty, non-obviousness, and industrial applicability.

The present invention is disclosed above by preferred embodiments. However, persons skilled in the art should understand that the preferred embodiments are illustrative of the present invention only, but should not be interpreted as restrictive of the scope of the present invention. Hence, all equivalent changes and modifications made to the aforesaid embodiments should fall within the scope of the present invention.

What is claimed is:

1. An electrode structure for use with a capacitive touch panel, comprising:
   a plurality of electrically conductive fine lines each forming a plurality of fine line portions, a plurality of sensing portions, and a plurality of cross portions, wherein the fine line portions, the sensing portions, and the cross portions together form a latticed pattern,
   wherein the sensing portions are each disposed between two corresponding ones of the cross portions, and two ends of each said sensing portion are connected to two corresponding ones of the cross portions through two corresponding ones of the fine line portions, respectively, the sensing portions each having a geometric configuration with a short axis and along axis, the long axis extending in a direction along the adjacent fine line portion, and the short axis being of a width larger than a width of the adjacent fine line portion.

2. The electrode structure of claim 1, wherein the short axis is of the width Wa, and the adjacent fine line portion is of the width Wb, such that $Wb*1.1 \leq Wa \leq Wb*1.8$.

3. The electrode structure of claim 1, wherein the long axis is of a length L1, and each side of each said square of the latticed pattern is denoted with L2, such that L2*0.08≤L1≤L2*0.1.

4. The electrode structure of claim 1, wherein the sensing portions are each of an elliptic shape, a rhomboid shape, or a rectangular shape.

5. The electrode structure of claim 1, wherein the fine line portions are each a straight line or a curve.

6. The electrode structure of claim 1, wherein the fine line portions are each of a width of 3 μm to 8 μm.

7. The electrode structure of claim 1, wherein the fine lines are made of one of copper, aluminum, nickel, iron, gold, silver, stainless steel, tungsten, chromium, titanium, and an alloy thereof.

8. A capacitance sensor for use with a capacitive touch panel, comprising:
- a first electrode comprising a plurality of electrically conductive first fine lines; and
- a second electrode comprising a plurality of electrically conductive second fine lines, wherein a plurality of first fine line portions, a plurality of first sensing portions, and a plurality of first cross portions of claim 1 are formed on each of the first fine lines, and a plurality of second fine line portions, a plurality of second sensing portions, and a plurality of second cross portions of claim 1 are formed on each of the second fine lines, wherein each said first sensing portion of the first electrode and a corresponding one of the second sensing portions of the second electrode insulate and overlap each other.

9. The capacitance sensor of claim 8, further comprising a transparent substrate, wherein the first electrode is formed on a surface of the transparent substrate, and the second electrode is formed on another surface of the transparent substrate.

10. The capacitance sensor of claim 8, further comprising:
- a first transparent substrate with a surface having thereon the first electrode; and
- a second transparent substrate with a surface having thereon the second electrode.

* * * * *